(12) United States Patent
Mehta et al.

(10) Patent No.: US 12,088,060 B2
(45) Date of Patent: Sep. 10, 2024

(54) MULTI-WAVELENGTH LASER GENERATOR USING RING FILTER

(71) Applicant: Intel Corporation, Santa Clara, CA (US)

(72) Inventors: Karan Mehta, Santa Clara, CA (US); Richard Jones, San Mateo, CA (US); Ranjeet Kumar, Milpitas, CA (US); Guan-Lin Su, Mountain View, CA (US); Duanni Huang, San Jose, CA (US); Haisheng Rong, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 765 days.

(21) Appl. No.: 17/074,050

(22) Filed: Oct. 19, 2020

(65) Prior Publication Data

US 2021/0057880 A1     Feb. 25, 2021

(51) Int. Cl.
*H01S 5/068*     (2006.01)
*H01S 5/065*     (2006.01)
(Continued)

(52) U.S. Cl.
CPC ............ *H01S 5/068* (2013.01); *H01S 5/0651* (2013.01); *H01S 5/06821* (2013.01); *H01S 5/125* (2013.01); *H01S 5/3013* (2013.01)

(58) Field of Classification Search
CPC .... H01S 5/068; H01S 5/0651; H01S 5/06821; H01S 5/125; H01S 5/3013;
(Continued)

(56) References Cited

U.S. PATENT DOCUMENTS 6,959,028 B2 * 10/2005 Jones ................. G02B 6/12004
372/102
8,005,122 B2 * 8/2011 Shimizu ................ H01S 5/0602
372/18
(Continued)

FOREIGN PATENT DOCUMENTS

JP     2017098362 A     6/2017
WO     2019120270 A1     6/2019

OTHER PUBLICATIONS

Office Action issued Nov. 20, 2023 for EP Application No. 21190715.9, 4 pages.
(Continued)

*Primary Examiner* — Vu A Vu
(74) *Attorney, Agent, or Firm* — Schwabe, Williamson & Wyatt, P.C.

(57) ABSTRACT

Embodiments of the present disclosure are directed to multi-wavelength laser generator may produce light with a frequency comb having equally spaced frequency lines. In various embodiments, the laser generator includes first, a semiconductor gain element is used to provide gain to the laser being generated. Second, a ring resonator filter, or ring filter, is used to select the wavelength comb spacing. Third, a narrow-band DBR or narrow-band mirror is used to select the number of wavelengths that lase. Fourth, a wide-band or narrow-band mirror is used to provide optical feedback and to form the optical cavity. Fifth, a phase tuner section is used to align the cavity modes with the ring resonances (i.e. the ring filter modes) in order to reduce or minimize the modal loss. Other embodiments may be described and/or claimed.

19 Claims, 7 Drawing Sheets

(51) Int. Cl.
*H01S 5/125* (2006.01)
*H01S 5/30* (2006.01)

(58) Field of Classification Search
CPC ............... H01S 3/10053; H01S 5/0617; H01S 5/06256; H01S 5/1064; H01S 5/1007; H01S 5/142; H01S 5/0604; H01S 5/0071; H01S 5/0078; H01S 5/0608
USPC .......................................................... 372/20
See application file for complete search history.

(56) References Cited

U.S. PATENT DOCUMENTS

| | | | |
|---|---|---|---|
| 8,837,548 B2* | 9/2014 | Tanaka | H01S 5/142 372/50.11 |
| 9,130,350 B2* | 9/2015 | Jeong | H01S 5/146 |
| 9,270,078 B2* | 2/2016 | Rickman | H01S 3/10053 |
| 9,318,868 B2* | 4/2016 | Creazzo | H01S 3/10053 |
| 9,356,419 B1 | 5/2016 | Orcutt | |
| 9,450,379 B2* | 9/2016 | Zhang | H01S 5/343 |
| 9,768,587 B1* | 9/2017 | Zheng | H01S 5/1092 |
| 9,780,528 B1* | 10/2017 | Zheng | H01S 5/1071 |
| 9,882,349 B1* | 1/2018 | Krishnamoorthy | H01S 5/142 |
| 9,939,663 B2* | 4/2018 | Luo | G02F 1/011 |
| 10,038,301 B1* | 7/2018 | Eggleston | H01S 5/1092 |
| 10,243,328 B2* | 3/2019 | Zhang | H01S 5/146 |
| 10,281,746 B2* | 5/2019 | Zheng | H01S 5/125 |
| 10,355,448 B2* | 7/2019 | Sugiyama | H01S 5/101 |
| 10,680,410 B2* | 6/2020 | Ma | H01S 5/1025 |
| 10,826,272 B2* | 11/2020 | Bovington | G02F 1/2257 |
| 2018/0269654 A1 | 9/2018 | Zhang et al. | |

OTHER PUBLICATIONS

S. Andreou et al., "Monolithically integrated InP-based DBR lasers with an intra-cavity ring resonator," Optics Express, vol. 27, No. 19, Sep. 16, 2019, 4 pages.

Y. Zhang et al., "Quantum dot SOA/silicon external cavity multi-wavelength laser," Optics Express, vol. 23, No. 4, Feb. 13, 2015, 6 pages.

N. Yasuoka et al., "External-Cavity Quantum-Dot Laser with Silicon Photonics Waveguide Mirror for Four-Wavelength Simultaneous Oscillation with an 800 GHz Channel Spacing," IEEE Explore, (2016), 2 pages.

T. Kita et al., "Tunable Dual-Wavelength Heterogeneous Quantum Dot Laser Diode With a Silicon External Cavity," Journal of Lightwave Technology, vol. 36, No. 2, Jan. 15, 2018, 6 pages.

M. Mielke et al., "Multiwavelength Modelocked Semiconductor Lasers," IEEE Journal on Selected Areas in Communications, vol. 25, No. 4, Apr. 2007, 9 pages.

Extended European Search Report issued Apr. 14, 2022 for EP Application No. 21190715.9, 8 pages.

* cited by examiner

MULTI-WAVELENGTH LASER GENERATOR USING RING FILTER

TECHNICAL FIELD

Embodiments of the present disclosure generally relate to the field of lasers, and in particular to multi-wavelength laser generators.

BACKGROUND

Computing platforms are increasingly using photonic elements that are silicon based. These photonic elements, which may be implemented as photonic integrated circuits (PIC) attached to single mode fibers or multi-mode fibers.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure are directed to a multi-wavelength laser generator that uses a ring filter and one or more DBR mirrors in the laser cavity. The radius of the ring filter is used to set the frequency spacing of the multi-wavelength laser being generated. The DBR stopband width determines the number of lasing modes. In some embodiments, a phase tuner is also employed. The phase tuner is arranged to reduce or minimize the modal loss by ensuring that the cavity modes are substantially aligned with the ring filter modes.

In embodiments, the multi-wavelength laser generator may produce light with a frequency comb having equally spaced frequency lines. In various embodiments, the laser generators include at least five components. First, a semiconductor gain element is used to provide gain to the light being generated. Second, a ring resonator filter, or ring filter is used to select the wavelength comb spacing. Third, a narrow-band DBR or narrow-band mirror is used to select the number of wavelengths that lase. Fourth, a wide-band or narrow-band mirror is used to provide optical feedback and to form the optical cavity. Fifth, a phase tuner section is used to align the cavity modes with the ring resonances (i.e. the ring filter modes) in order to reduce or minimize the modal loss. In embodiments, the ring filter in combination with a laser source transmits light with peaks that are equally spaced in frequency. Light with peaks that are equally spaced in frequency may also be referred to as a frequency comb shape.

Embodiments described herein are directed to a laser generator design to generate a custom frequency or wavelength comb spectrum that has an arbitrary number of output wavelengths that are uniformly spaced apart in frequency/wavelength. In embodiments, the laser generator design may use only one gain element. Embodiments may include a mirror design which includes a ring filter and a distributed DBR using silicon photonics technology. Embodiments described herein permit a more compact comb laser source as compared to legacy technologies including a laser array. Embodiments described herein may be used for wavelength-division multiplexing (WDM) with single or multiple circuits up to 100 Gb and beyond.

Legacy architectures to implement a comb spectrum typically focus on single-mode operation, multiple rings filters, or implementing a plurality of single mode lasers. Embodiments described herein enable a single laser architecture to be used to create multi-wavelength lasers with various wavelength spacing and a plurality of wavelengths by changing the ring filter and/or the DBR design.

In embodiments, wavelength selection is decoupled from the makeup of the gain element, for example using III-V materials, by using a ring filter. The ring filter ensures that the wavelength is independent of fluctuations in the III-V materials and from the diode current, which may cause self-heating in the gain element, thus improving manufacturability and wavelength targeting requirements. In embodiments, the radius of the ring filter may indicate how the ring filter is being used for multi-wavelength comb generation or for single-mode narrow-linewidth operation. The radius of the ring is used to set the free spectral range (FSR) of the ring modes.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
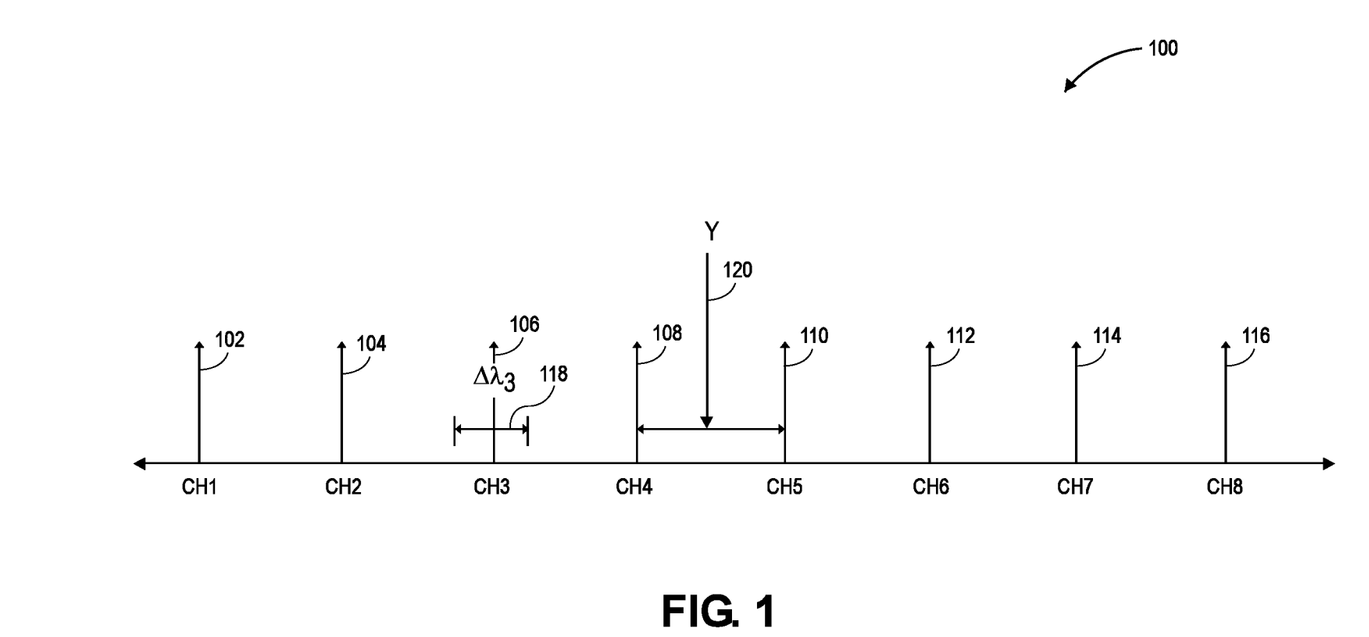
FIG. 1 is an example spectrum of an eight-wavelength comb laser, in accordance with various embodiments.

FIG. 1 is an example spectrum of an eight-wavelength comb of an example laser, in accordance with various embodiments. Wavelength spectrum 100 includes 8 wavelengths 102, 104, 106, 108, 110, 112, 114, 116 that are equally spaced apart. Each of these wavelengths, which may be referred to by the symbol λ, as channels (CH), as frequencies, as lines, or as lasing lines, may be used to encode data or portions of data that is to be optically transmitted.

In embodiments, each wavelength, for example wavelength 106, may fall within a certain wavelength range 118. In embodiments, this may be represented as a Δλ, which is the acceptable error for that comb wavelength. A distance between wavelengths, such as between wavelength 108 and wavelength 110, may fall within a wavelength range 120, plus or minus a factor Y, where Y corresponds to the FSR of the ring filter. In other embodiments, within wavelength spectrum 100, there may be N different wavelengths on which data or portions of data may be encoded and transmitted. Note that different embodiments may use different wavelength spacing, which may be determined by the characteristics of the components described below. In embodiments, equally spaced wavelengths may be used as an optical source for WDM or other applications.

Figure 2:
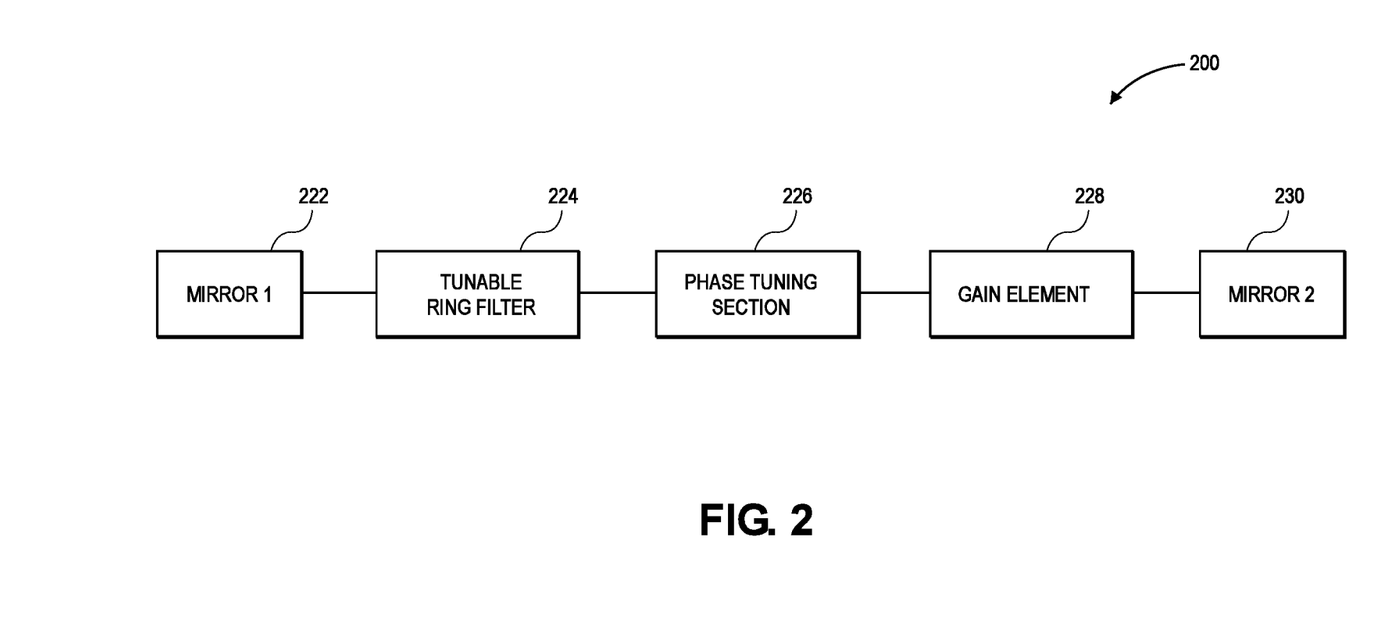
FIG. 2 is a block diagram of a ring-based comb laser apparatus, in accordance with various embodiments.

FIG. 2 is a block diagram of a ring-based comb laser apparatus, in accordance with various embodiments. Diagram 200 includes mirrors 222, 230, that act as wavelength selective mirrors for the laser cavity. In embodiments, at least one of the mirrors 222, 230 is a DBR that is designed to allow only N number of modes to lase. The other mirror may be a broadband mirror, for example a loop mirror or another DBR. Note: the narrow-band DBR is used in selecting the number of lasing wavelengths. The mirrors and their placement are discussed in greater detail with respect to FIG. 5 below.

The gain element 228 is the active section of the laser, for example the III/V active region, that provides the optical gain. In embodiments, the gain element 228 may include Quantum Dots, for example, quantum confinement in three dimensions. In embodiments, the gain element 228 may include Quantum Wires, for example, quantum confinement in two dimensions. In embodiments, the gain element 228 may include Quantum Wells, for example, quantum confinement in one dimension. In embodiments, the gain element 228 may include bulk material that may have no quantum confinement. The gain element is discussed further with respect to FIG. 5 below.

The tunable ring filter 224 selects the spacing between the modes, or FSR. This spacing is given by the equations:

$$\Delta v \text{ (Hz)} = \frac{c}{(2\pi R * n_g)}$$

$$\Delta \lambda \text{ (m)} = \frac{\lambda^2}{(2\pi R * n_g)}$$

where c is the speed of light, $n_g$ is the group index, Δv and Δλ are the FSR in frequency and wavelength space respectively, and R is the radius of the ring filter.

Thus, the ring filter only allows energy at these resonant wavelengths to pass through with low loss. The absolute wavelengths can be tuned by, for example, using a heater that is integrated with the ring filter, which allows for precise wavelength targeting. Thus, the radius of the ring filter selects the frequency spacing of the comb, for example wavelength distance 120 of FIG. 1, while the tunable ring filter allows for absolute wavelength targeting.

The phase tuning section 226 affects the absolute wavelengths of the cavity's Fabry-Perot modes, where the cavity modes have a FSR that is smaller than the FSR of the ring filter. This means that there may be a misalignment between the cavity mode and the ring mode, which would increase the loss. The phase tuning section 226 allows the cavity modes' wavelengths to be tuned to reduce or minimize the overall loss for all of the lasing modes by lining them up with the modes of the ring. This is shown below in more detail with respect to FIG. 4.

Figure 3:
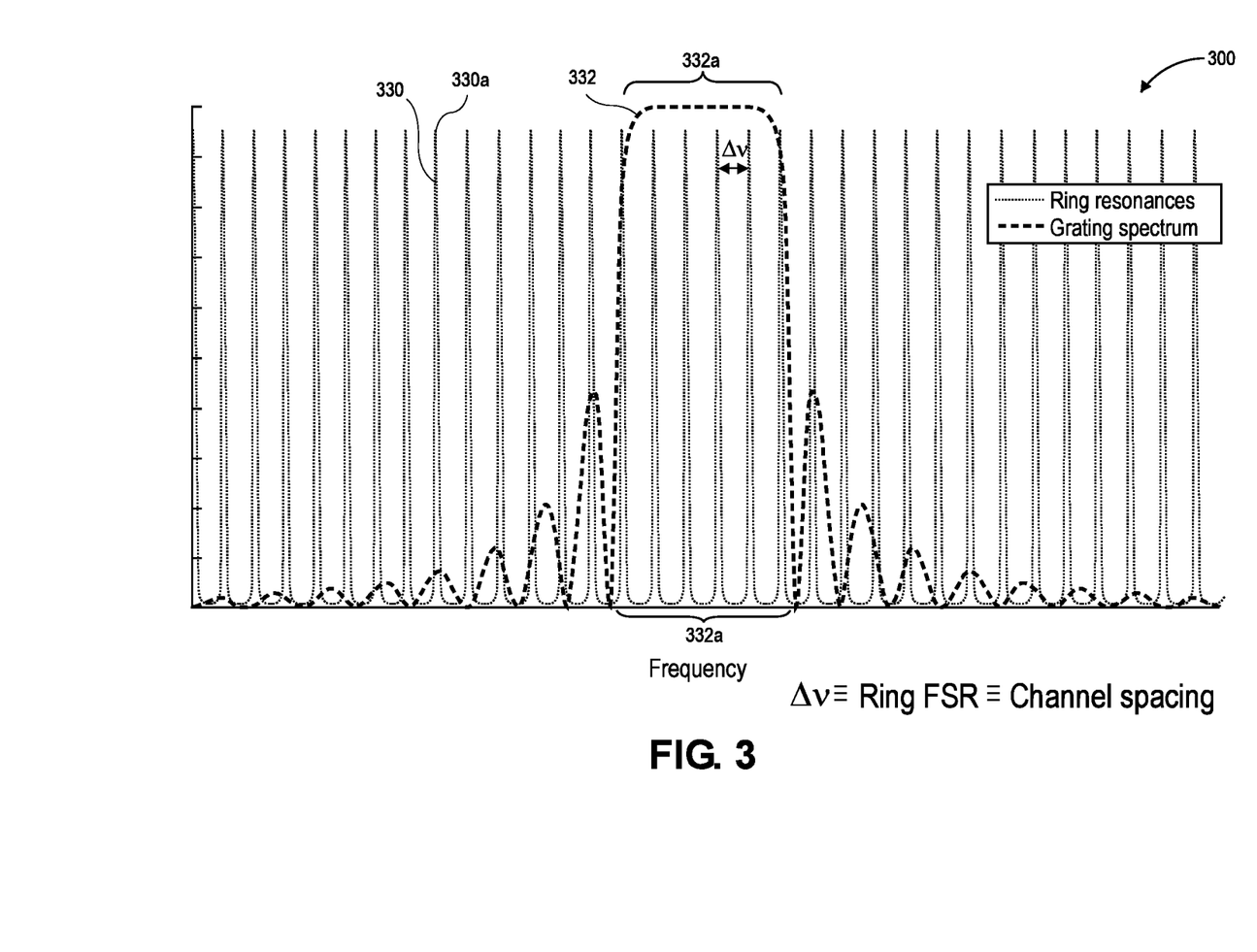
FIG. 3 shows an overlay plot of a ring filter transmissivity spectrum and a distributed Bragg reflector (DBR) reflectivity spectrum, in accordance with various embodiments.

FIG. 3 shows an overlay plot of a ring filter transmissivity spectrum and a DBR reflectivity spectrum, in accordance with various embodiments. Plot 300 shows the transmission spectrum of the ring filter 330, which may be also referred to as ring resonances, overlaid with the DBR reflectivity spectrum 332, which may be referred to as the grating spectrum.

The transmission peaks 330a in the spectrum of the ring filter are all equally spaced in frequency, for example Δv. In embodiments, this is the basis for generating the comb laser spectra. The curve 330 can be tuned in frequency/wavelength by the ring filter tuner, for example by using an integrated heater that causes temperature changes that changes the refractive index and, which in turn, changes the resonant wavelength Δv.

As shown, only the ring modes within the stop-band of the DBR 332a will be reflected back, for example as feedback. All ring modes outside the stop-band of the DBR 332a undergo high loss and hence these ring modes will not lase. As shown in plot 300, approximately five ring modes fit inside the stop-band of the DBR 332a. This number can be easily changed by changing the DBR coupling coefficient by changing the DBR grating's depth, duty cycle, refractive index contrast, optical mode's overlap with the grating, which may be referred to as the grating's optical confinement factor. For example, a higher coupler coefficient increases the width of the stop-band of the DBR 332a and incorporates more modes.

Figure 4:
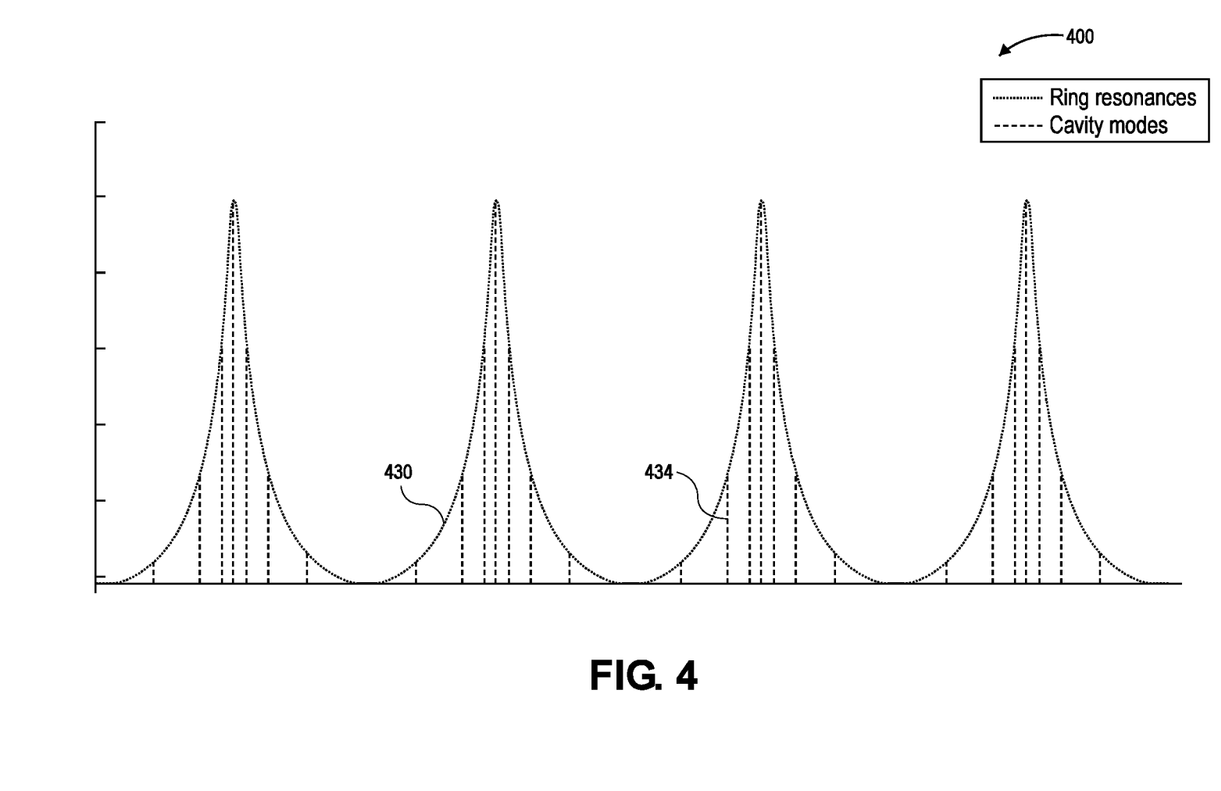
FIG. 4 shows an overlay plot of a ring filter transmissivity spectrum and the laser cavity's Fabry-Perot cavity modes, in accordance with various embodiments.

FIG. 4 shows an overlay plot of a ring filter transmissivity spectrum and the laser cavity's Fabry-Perot cavity modes, in accordance with various embodiments. Plot 400 shows an overlay of the ring filter's transmissivity spectrum 430 and the laser cavity's Fabry-Perot modes 434. It should be noted that FIG. 3 is about the DBR and ring spectra, which affects the mode spacing and number of lasing modes. FIG. 4 is about the ring filter and Fabry-Perot cavity modes, and reducing or minimizing the optical loss of lasing modes.

Figure 5:
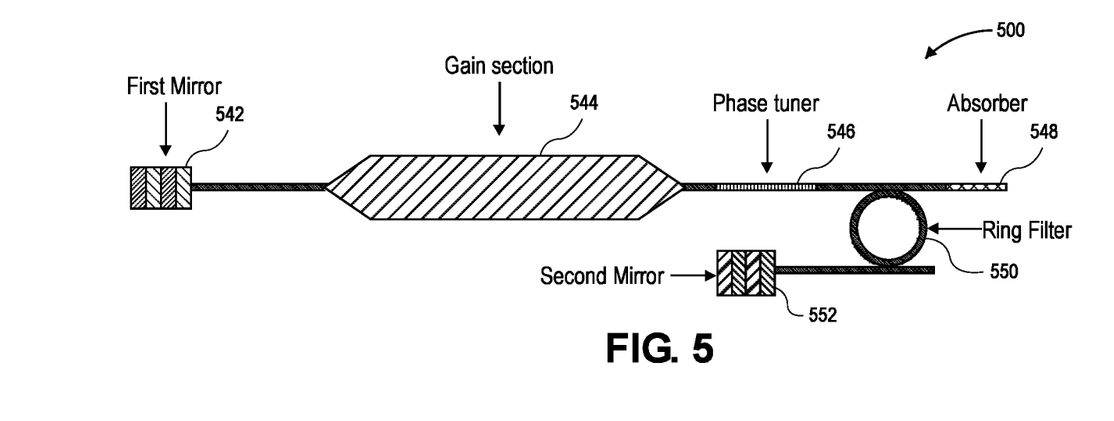
FIG. 5 shows a first embodiment of a laser architecture to generate a comb frequency laser, in accordance with various embodiments.

FIG. 5 shows a first embodiment of a laser architecture to generate a comb frequency laser, in accordance with various embodiments. First embodiment 500 includes a first mirror 542, that is optically coupled with a gain section 544. Gain section 544 may be optically coupled with a phase tuner 546, which in turn is optically coupled with an absorber 548. Between the phase tuner 546 and the absorber 548 there may be a ring filter 550. Note that the phase tuner 546 may be on either side of the gain section 544. In embodiments, the ring filter 550 may be a tunable ring filter. In embodiments, the ring filter 550 may be optically coupled with a second mirror 552, which completes the optical cavity.

One of the first mirror 542 or the second mirror 552 is a DBR or a narrow-band DBR that is used for selecting the number of modes. The other mirror may be a wide-band mirror, for example a DBR with a wider stop-band or a loop mirror. In embodiments, the first mirror 542 and the second mirror 552 act as wavelength selective mirrors for the laser cavity, with at least one mirror 542, 552 being a DBR that allows only N number of modes to lase.

The gain section 544 is the active section of the laser and may include a III/V active region to provide optical gain. The phase tuner 546 allows the cavity modes to be tuned to cavity resonances to reduce the overall loss for the lasing modes, by aligning cavity resonances with the ring filter 550 modes. An example of this is shown with respect to FIG. 4. The absorber 548 prevents spurious reflections of photons back into the optical cavity whose wavelengths are rejected by the ring filter 550. The phase tuner 546 can be on any side of the gain section 544. In embodiments, the ring filter 550, gain section 544, and phase tuner 546 may be situated in any order within the two mirrors 542, 552.

This comb laser design is highly customizable, with the radius of the ring filter 550 setting the frequency combs spacing, tuning of the ring filter 550 controlling the absolute wavelengths. The stop-band widths, or coupling coefficient, of the DBRs 542 and/or 552 determine the number of lasing modes. The phase tuner 546 minimizes the loss by ensuring that the cavity modes line up with the ring filter modes. The ring filter 550 resonant wavelengths may be tuned by an integrated ring heater (not shown), by charge injection or by depletion.

Figure 6:
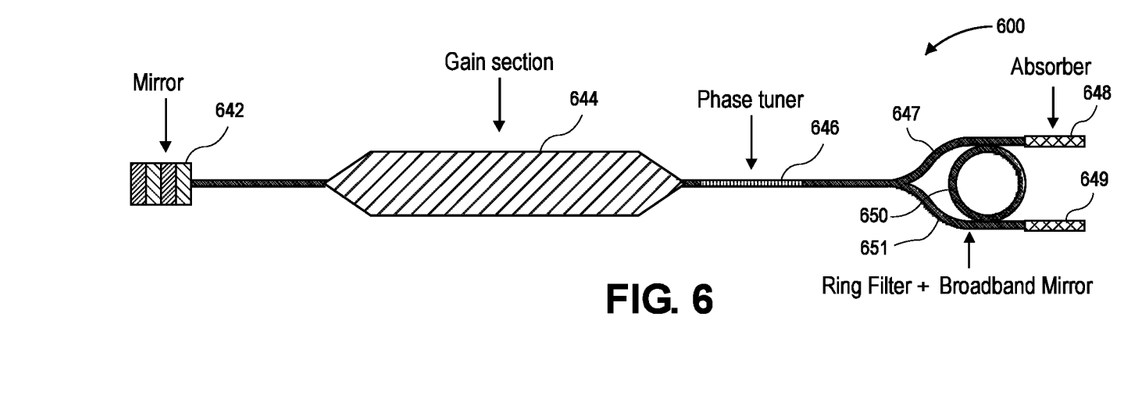
FIG. 6 shows a second embodiment of a laser architecture to generate a comb frequency laser, in accordance with various embodiments.

FIG. 6 shows a second embodiment of a laser architecture to generate a comb frequency laser, in accordance with various embodiments. Second embodiment 600 may be similar to the first embodiment 500 and FIG. 5. However, in second embodiment 600 there is only one mirror 642, which may be similar to the first mirror 542 of FIG. 5 that is coupled to the gain section 644 which may be similar to gain section 544. The mirror 642 is a DBR or a narrow-band DBR that is used to select the number of wavelengths that may lase. The phase tuner 646 may be similar to the phase tuner 546 of FIG. 5. However, after the phase tuner 646 the optical coupling splits into two optical paths 647, 651. In embodiments, the ring filter 650 serves as the broadband mirror. Light entering paths 647 loops back through paths 651 via the ring filter 650, and vice versa from path 651 to 647 through ring filter 650. Both paths 647, 651 are coupled with absorbers 648, 649 that absorbed photons whose wavelengths are not resonant with the ring filter 650 modes.

Figure 7:
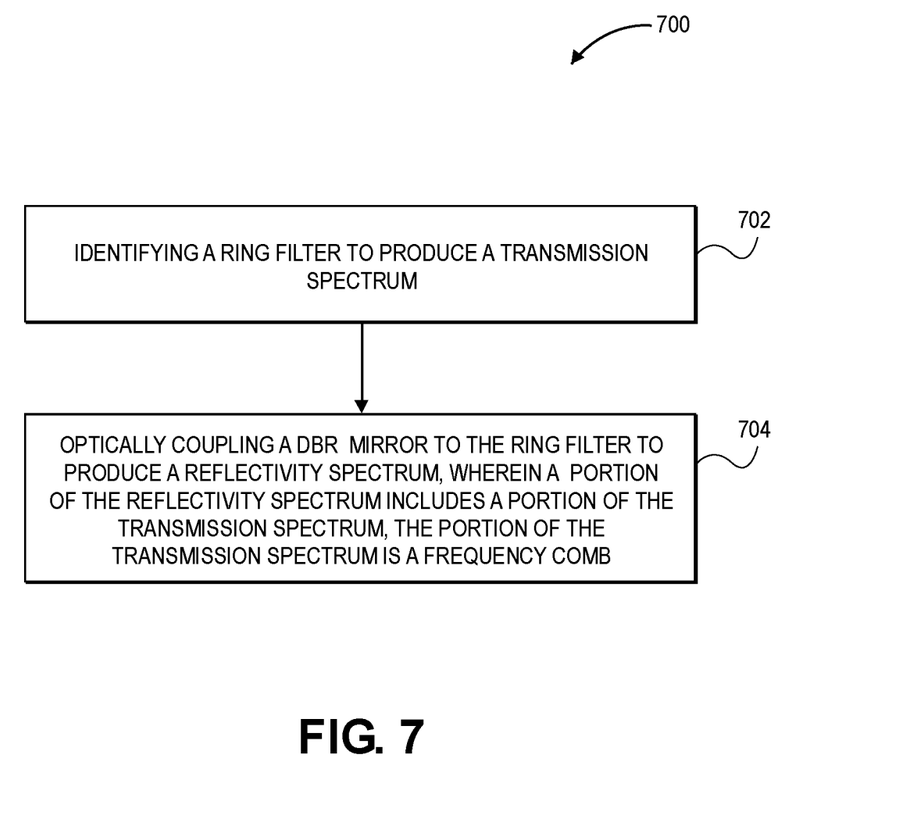
FIG. 7 is a process for creating a comb frequency laser generator, in accordance with various embodiments.

FIG. 7 is a process for creating a comb frequency laser generator, in accordance with various embodiments. Process 700 may be implemented using the components and techniques as described herein, and in particular with respect to FIGS. 1-6.

At block 702, the process includes identifying a ring filter to produce a transmission spectrum. In embodiments, the ring filter may be similar to ring filter 550 of FIG. 5. In embodiments, the ring filter may be a tunable ring filter with an adjustable diameter to control the number of wavelengths that are lased.

At block 704, the process may include optically coupling a DBR mirror to the ring filter to produce a reflectivity spectrum, wherein a portion of the reflectivity spectrum includes a portion of the transmission spectrum, wherein the portion of the transmission spectrum is a multi-wavelength comb laser. In embodiments, the DBR mirror may be similar to the first mirror 542 or the second mirror 552 of FIG. 5. The ring filter may include the ring filter 550 of FIG. 5. The portion of the reflectivity spectrum that includes a portion of the transmission spectrum may be shown in area 332a of FIG. 3.

Figure 8:
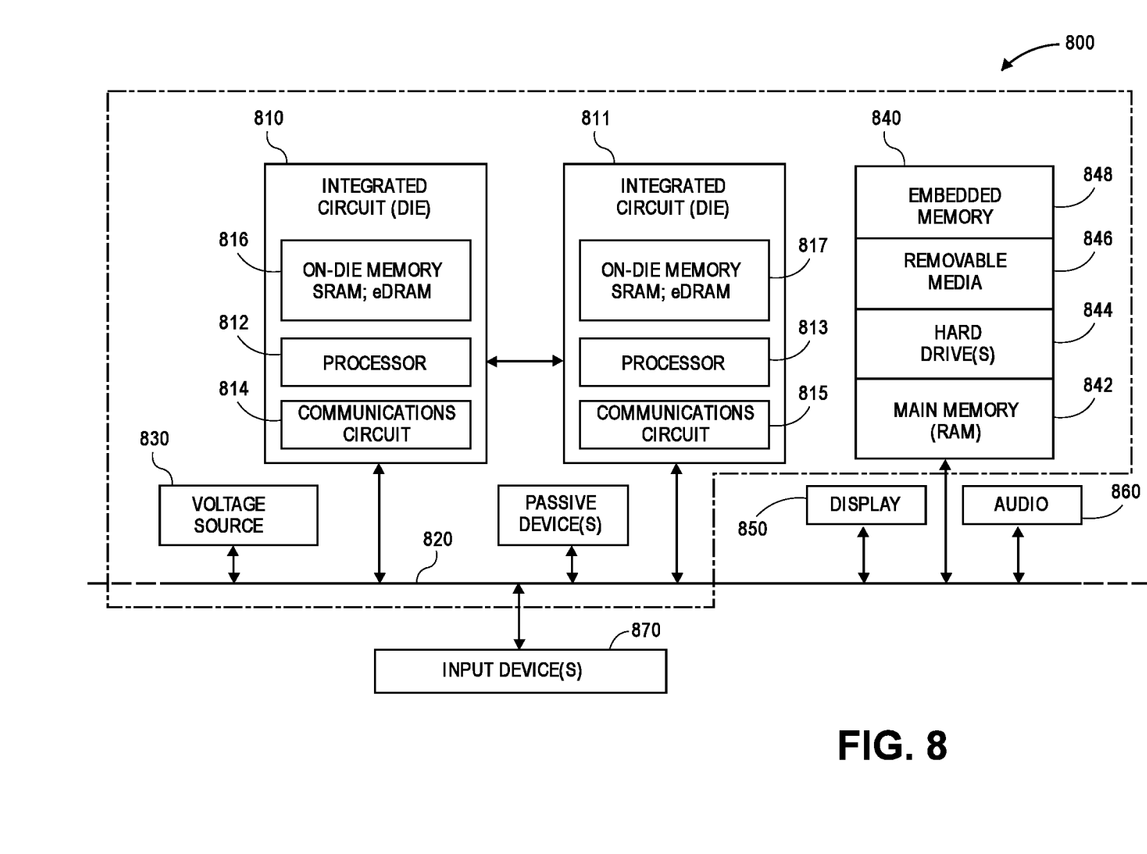
FIG. 8 schematically illustrates a computing device 800 in accordance with one embodiment.

Embodiments of the present disclosure may be implemented into a system using any suitable hardware and/or software to configure as desired. FIG. 8 schematically illustrates a computing device 800 in accordance with one embodiment. The computer system 800 (also referred to as the electronic system 800) as depicted can embody a multi-wavelength comb frequency laser generator, according to any of the several disclosed embodiments and their equivalents as set forth in this disclosure. In particular, one or more of the communication circuits 814, 815 may embody a multi-wavelength comb frequency laser generator. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically and/or optically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, a sensor, or another processor. In an embodiment, the processor 812 includes, or is coupled with, a multi-wavelength comb frequency laser generator, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a package having a multi-wavelength comb frequency laser generator, according to any of the several disclosed embodiments and their equivalents, an electronic system, a computer system, one or more methods of fabricating an integrated circuit, and one or more methods of fabricating an electronic assembly that includes a package having a multi-layer optical coupler, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed multi-wavelength comb frequency laser and their equivalents. A foundation multi-layer PCB may be included, as represented by the dashed line of FIG. 8. Passive devices may also be included, as is also depicted in FIG. 8.

Ideally, each block 810, 811, and 840 should have their own optical transceivers so that they be optically connected to each other, i.e. they can send data from and to each other in the form of optical signals. Optical signals may be used to communicate within one block (810, 811, and 840) and between these blocks. Bus 820 can represent optical as well electrical buses.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

Some non-limiting examples are provided below.

EXAMPLES

Example 1 is a laser apparatus, comprising: a laser source to output light; one or more mirrors optically coupled to the laser source and arranged to facilitate emission of the light in a plurality of modes; a gain element optically coupled with the mirror; a phase tuner, optically coupled with the gain element, to tune wavelengths of a plurality of modes of the laser source; and a ring filter optically coupled with the phase tuner to select spacing between the modes of the laser.

Example 2 include the apparatus of example 1, wherein the ring filter comprises a tunable ring filter.

Example 3 may include the apparatus of example 1, wherein at least one of the one or more mirrors is a distributed Bragg reflector (DBR) or a mirror with a controllable stop-band width at a lasing wavelength range.

Example 4 may include the apparatus of example 1, wherein the plurality of modes is predetermined.

Example 5 may include the apparatus of example 1, wherein the emission of light includes a frequency comb.

Example 6 may include the apparatus of example 1, wherein the gain element is the only gain element in the laser apparatus.

Example 7 may include the apparatus of example 1, wherein a radius of the ring filter determines a frequency spacing between the modes of the laser.

Example 8 may include the apparatus of example 1, wherein the one or more mirrors comprises a first and a second mirror; and wherein the first mirror is a distributed Bragg reflector (DBR), and the second mirror is a broadband mirror.

Example 9 may include the apparatus of example 1, further comprising an absorber optically coupled to the ring filter to prevent reflections of photons back into an optical cavity.

Example 10 may include the apparatus of example 1, wherein the phase tuner and the ring filter are optically coupled with a split optical path having a first optical path and a second optical path.

Example 11 may include the apparatus of any one of examples 1-10, further comprising an absorber optically coupled to the first optical path or to the second optical path to prevent reflections of photons back into an optical cavity.

Example 12 may be a method for producing a frequency comb of transmission peaks equally spaced in frequency over a determined frequency range, the method comprising: filtering input light by a ring filter to produce output light with a transmission spectrum of transmission peaks equally spaced in frequency; and limiting the output light from the ring filter that is reflected by an optically coupled distributed Bragg reflector (DBR) mirror to a reflectivity spectrum of the DBR mirror, wherein the determined frequency range of the frequency comb is a reflectivity spectrum of the DBR mirror.

Example 13 may include the method of example 12, wherein the output light with a transmission spectrum of transmission peaks equally spaced in frequency forms a frequency comb shape.

Example 14 may include the method of example 12, wherein the ring filter is a tunable ring filter.

Example 15 may include the method of example 14, wherein a diameter of the tunable ring filter varies a distance between the transmission peaks.

Example 16 may include the method of any one of examples 12-15, further comprising optically coupling another mirror to the ring filter, wherein the other mirror is a broadband mirror or a broadband loop mirror.

Example 17 is a system, comprising: an optical connector; a laser apparatus optically coupled with the optical connector, the laser apparatus comprising: a mirror, to provide for optical feedback of light produced by a laser source, in a plurality of modes; a gain element optically coupled with the mirror to provide gain to the plural modes of the light; a phase tuner, optically coupled with the gain element, to tune wavelengths of a plurality of modes of the light; and a ring filter optically coupled with the phase tuner to select spacing between the wavelengths of light.

Example 18 may include the system of example 17, the laser apparatus further comprising a laser cavity; and wherein a plurality of modes of the laser cavity further includes a plurality of Fabry-Perot modes of the laser cavity.

Example 19 may include the system of example 17, wherein the gain element is the only gain element in the laser apparatus.

Example 20 may include the system of any one of examples 17-19, wherein a radius of the ring filter selects a frequency spacing between the wavelengths of light.

We claim:

1. A laser apparatus, comprising:
a laser source to output light;
one or more mirrors optically coupled to the laser source and arranged to:
facilitate emission of the light in a first subset of two or more optical modes of a plurality of optical modes that are equally spaced from one another in a frequency domain, wherein the two or more optical modes are adjacent to one another in the plurality of optical modes; and
suppress emission of the light in a second subset of the plurality of optical modes that are equally spaced from one another in the frequency domain, wherein respective frequencies of the second subset of the plurality of optical modes are higher or lower than respective frequencies of optical modes in the first subset; and
a ring filter optically coupled with the one or more mirrors, wherein adjustment of the ring filter changes a spacing between respective modes of the plurality of optical modes in the frequency domain.

2. The laser apparatus of claim 1, wherein the ring filter comprises a tunable ring filter.

3. The laser apparatus of claim 1, wherein at least one of the one or more mirrors is a distributed Bragg reflector (DBR), or a mirror with a controllable stop-band width at a lasing wavelength range.

4. The laser apparatus of claim 1, further comprising a phase tuner that is configured to tune respective modes of the plurality of optical modes.

5. The laser apparatus of claim 1, wherein the laser apparatus is configured to output the first subset of the plurality of optical modes in a frequency comb shape.

6. The laser apparatus of claim 1, further comprising a gain element that is the only gain element in the laser apparatus.

7. The laser apparatus of claim 1, wherein the one or more mirrors comprises a first and a second mirror; and
wherein the first mirror is a distributed Bragg reflector (DBR), and the second mirror is a broadband mirror.

8. The laser apparatus of claim 1, further comprising an absorber optically coupled to the ring filter to prevent reflections of photons back into an optical cavity.

9. The laser apparatus of claim 4, wherein the phase tuner and the ring filter are optically coupled with a split optical path having a first optical path and a second optical path.

10. The laser apparatus of claim 9, further comprising an absorber optically coupled to the first optical path or to the second optical path to prevent reflections of photons back into an optical cavity.

11. A system, comprising:
an optical connector; and
a laser apparatus optically coupled with the optical connector, the laser apparatus comprising:
a mirror configured to:
facilitate emission of light in a first subset of a plurality of optical modes that are equally spaced from one another in a frequency domain, wherein a number of optical modes in the first subset is selectable; and
suppress emission of the light in a second subset of the plurality of optical modes;
a gain element optically coupled with the mirror, wherein the gain element is configured to provide gain to the first subset of optical modes of light;
a phase tuner, optically coupled with the gain element, wherein the phase tuner is configured to tune wavelengths of the first subset of optical modes of light; and
a ring filter optically coupled with the phase tuner, wherein the ring filter is configured to select a frequency spacing between the adjacent optical modes of the plurality of optical modes.

12. The system of claim 11, the laser apparatus further comprising a laser cavity; and
wherein the plurality of optical modes include a plurality of Fabry-Perot modes of the laser cavity.

13. The system of claim 11, wherein the gain element is the only gain element in the laser apparatus.

14. The system of claim 11, wherein a radius of the ring filter selects a frequency spacing between the wavelengths of light.

15. A method of generating a multimode optical output, wherein the method comprises:
facilitating, based on one or more mirrors optically coupled with a laser source that is configured to generate light, emission of the light in a first subset of two or more contiguous optical modes of a plurality of optical modes that are equally spaced from one another in a frequency domain, wherein a spacing between respective modes of the plurality of optical modes in the frequency domain is based on a ring filter that is optically coupled with the one or more mirrors; and suppressing, based on the one or more mirrors, emission of the light in a second subset of the plurality of modes, wherein respective optical modes of the second subset of the plurality of modes have frequencies that are higher or lower than respective frequencies of the two or more contiguous optical modes.

16. The method of claim 15, wherein the plurality of optical modes have a frequency comb shape.

17. The method of claim 15, further comprising increasing, by a gain element, an amplitude of the subset of optical modes.

18. The method of claim 15, further comprising tuning, by a phase tuner, respective frequencies of respective optical modes of the first subset of optical modes.

19. The method of claim 18, wherein the phase tuner is configured to adjust the respective frequencies of the respective optical modes based on resonant optical modes of the ring filter.

* * * * *